(12) United States Patent
Wen et al.

(10) Patent No.: US 8,697,508 B2
(45) Date of Patent: Apr. 15, 2014

(54) SEMICONDUCTOR PROCESS

(75) Inventors: Tsai-Yu Wen, Tainan (TW); Tsuo-Wen Lu, Kaohsiung (TW); Yu-Ren Wang, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/451,484

(22) Filed: Apr. 19, 2012

(65) Prior Publication Data
US 2013/0280878 A1  Oct. 24, 2013

(51) Int. Cl.
*H01L 21/336* (2006.01)

(52) U.S. Cl.
USPC ..... 438/197; 438/300; 438/303; 257/E21.409

(58) Field of Classification Search
USPC ......... 438/197, 299, 300, 303, 308, 595, 798; 257/E21.409, E21.431
See application file for complete search history.

(56) References Cited

U.S. PATENT DOCUMENTS

| | | | | |
|---|---|---|---|---|
| 6,146,934 A * | 11/2000 | Gardner et al. | | 438/230 |
| 6,790,784 B2 * | 9/2004 | Catabay et al. | | 438/726 |
| 6,800,907 B2 * | 10/2004 | Kim et al. | | 257/356 |
| 6,955,965 B1 | 10/2005 | Halliyal | | |
| 7,642,152 B2 | 1/2010 | Wang | | |
| 8,329,570 B2 * | 12/2012 | Fukuda et al. | | 438/595 |
| 2005/0118769 A1 * | 6/2005 | Kammler et al. | | 438/303 |
| 2005/0233598 A1 * | 10/2005 | Jung et al. | | 438/785 |
| 2006/0281271 A1 * | 12/2006 | Brown et al. | | 438/303 |
| 2007/0128786 A1 * | 6/2007 | Cheng et al. | | 438/199 |
| 2009/0004799 A1 * | 1/2009 | Wirbeleit et al. | | 438/275 |
| 2010/0163983 A1 * | 7/2010 | Choi | | 257/336 |

* cited by examiner

*Primary Examiner* — Tuan N. Quach
(74) *Attorney, Agent, or Firm* — Winston Hsu; Scott Margo

(57) ABSTRACT

A semiconductor process includes the following steps. A gate structure is formed on a substrate. An oxide layer is formed and covers the gate structure and the substrate. A plasma process without oxygen is performed to densify the oxide layer. A material layer is formed and covers the oxide layer. The material layer and the oxide layer are etched to form a dual spacer.

16 Claims, 5 Drawing Sheets

SEMICONDUCTOR PROCESS

BACKGROUND OF THE INVENTION

1. Field of the Invention

The present invention relates generally to a semiconductor process, and more specifically to a semiconductor process, which performs a plasma process without oxygen to densify an oxide layer in a dual spacer.

2. Description of the Prior Art

For decades, chip manufacturers have obtained faster metal-oxide-semiconductor (MOS) transistors by making them smaller. As the semiconductor processes advance to the very deep sub micron dimensions such as 65-nm node or below, increasing the driving current for MOS transistors has become a critical issue. In order to improve device performances, crystal strain technology has been developed. Crystal strain technology is becoming more and more attractive as a mean for getting better performances in the field of MOS transistor fabrication. Putting a strain on a semiconductor crystal alters the speed at which charges move through that crystal. Strains make MOS transistors work better by enabling electrical charges, such as electrons, to pass more easily through the silicon lattice of the gate channel.

For the known arts, attempts have been made to use a strained silicon layer, which had been grown epitaxially on a silicon substrate with an epitaxial layer such as a silicon germanium (SiGe) layer disposed in between. In this type of MOS transistor, a biaxial tensile strain occurs in the epitaxial layer due to the silicon germanium which has a larger lattice constant than silicon, and, as a result, the band structure alters, and the carrier mobility increases. This enhances the speed performances of the MOS transistors. In another way, silicon carbide may be used to form an epitaxial layer for N-MOS transistors.

The steps of forming the epitaxial layer in the substrate beside the gate structure may include: a single-layer spacer is formed beside a gate structure, which may include a gate dielectric layer, a gate electrode layer and a spacer, in order to automatically etch the substrate and form at least a recess in the substrate beside the spacer. Then, an epitaxial layer is formed in the recess. The spacer is removed. Subsequent semiconductor processes, such as a source/region implantation process, are performed on the substrate and the gate structure.

However, some drawbacks occur when the single-layer spacer is applied. For instance, due to over-etching, the substrate below the single-layer spacer, which may have a lightly-doped source/drain region formed therein, will be damaged when the spacer is removed. Besides, a first spacer may be formed on the substrate beside the gate structure to form a lightly-doped source/drain region before the single-layer spacer is formed. The first spacer will be damaged when the single-layer spacer is removed after the epitaxial layer is formed, due to the material similarity of the single-layer spacer and the first spacer, thereby affecting the electrical performances of MOS transistors.

SUMMARY OF THE INVENTION

The present invention provides a semiconductor process, which performs a plasma process without oxygen on a dual spacer to densify an oxide layer in the dual spacer, thereby preventing the oxide layer from being consumed in later etching processes.

The present invention provides a semiconductor process including the following steps. A gate structure is formed on a substrate. An oxide layer is formed to cover the gate structure and the substrate. A plasma process without oxygen is performed to densify the oxide layer. A material layer is formed to cover the oxide layer. The material layer and the oxide layer are etched to form a dual spacer.

According to the above, the present invention provides a semiconductor process, which forms a dual spacer having an inner oxide layer and an outer material layer, and then performs a plasma process without oxygen on the oxide layer to densify the oxide layer. By doing this, the oxide layer consumption by subsequent etching processes such as a wet etching process can be avoided. Specifically, the wet etching process may be a pre-cleaning process performed after a recess is formed, and before an epitaxial layer is formed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
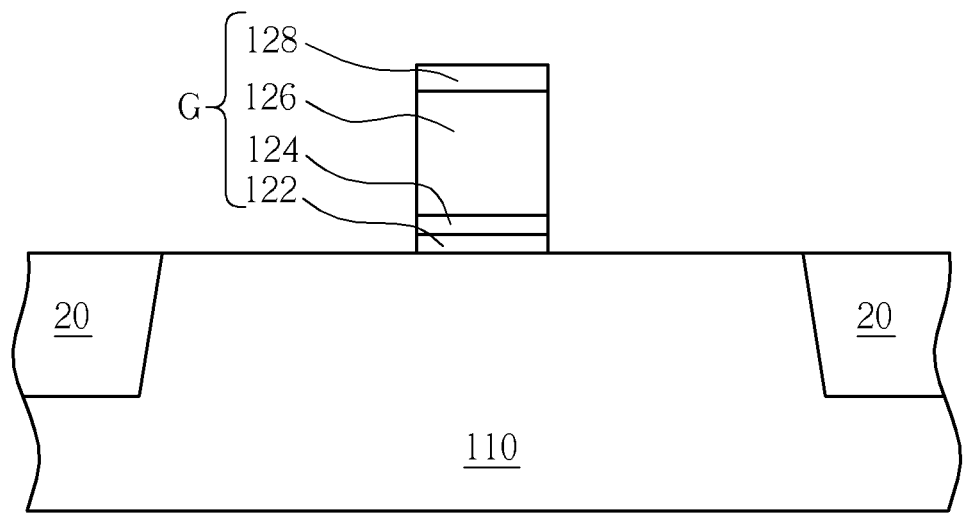
FIGS. 1-9 schematically depict cross-sectional views of a semiconductor process according to one embodiment of the present invention.

FIGS. 1-9 schematically depict cross-sectional views of a semiconductor process according to one embodiment of the present invention. A substrate 110 is provided. The substrate 110 may be a semiconductor substrate such as a silicon substrate, a silicon containing substrate, an III-V group-on-silicon (such as GaN-on-silicon) substrate, a graphene-on-silicon substrate or a silicon-on-insulator (SOI) substrate. An isolation structure 20 is formed between every transistor to electrically isolate these transistors. The isolation structure 20 may be a shallow trench isolation structure, but it is not limited thereto. A gate structure G is formed on the substrate 110. The gate structure G may include a stacked structure composed of a buffer layer 122, a dielectric layer 124, a gate layer 126 and a cap layer 128. More precisely, methods of forming the gate structure G may include: entirely and sequentially covering a buffer layer (not shown), a dielectric layer (not shown), a gate layer (not shown) and a cap layer (not shown) on the substrate 110; patterning their layers to form a buffer layer 122, a dielectric layer 124, a gate layer 126 and a cap layer 128.

The buffer layer 122 may include an oxide layer. The gate dielectric layer 124 may be a dielectric layer having a high dielectric constant, such as the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST). The gate layer 126 may include a polysilicon layer, or a sacrificial layer, which may be replaced by a metal layer to form a metal gate in sequential processes. The cap layer 128 may be a nitride layer or etc. The aforesaid materials of the buffer layer 122, the dielectric layer 124, the gate layer 126 and the cap layer 128 are just some cases, but the present invention is not restricted thereto.

Figure 2:
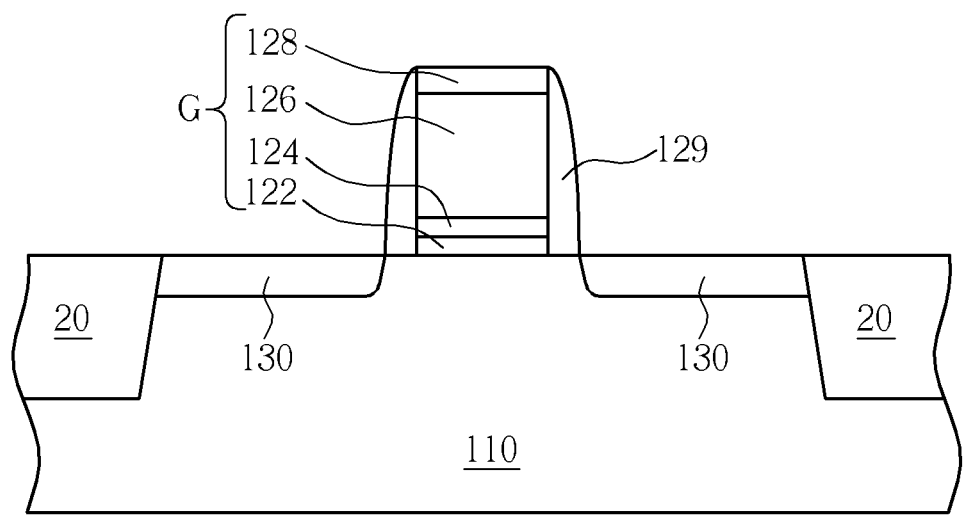

As shown in FIG. 2, a first spacer 129 is formed on the substrate 110 beside the gate structure G. For example, the spacer 129 may be formed by nitridation or oxidation etc.; or, a spacer material (not shown) can totally cover the cap layer 128 and the substrate 110; then, the spacer 129 is formed by an etching process. In this embodiment, the first spacer 129 may be a nitride layer, which is used to define and form a lightly doped source/drain region. In another embodiment, the first spacer 129 may be a single layer or a multilayer structure composed of silicon nitride, silicon oxide or etc. A lightly doped source/drain region 130 may be formed by methods such as an ion implantation process after the first spacer 129 is formed.

Figure 3:
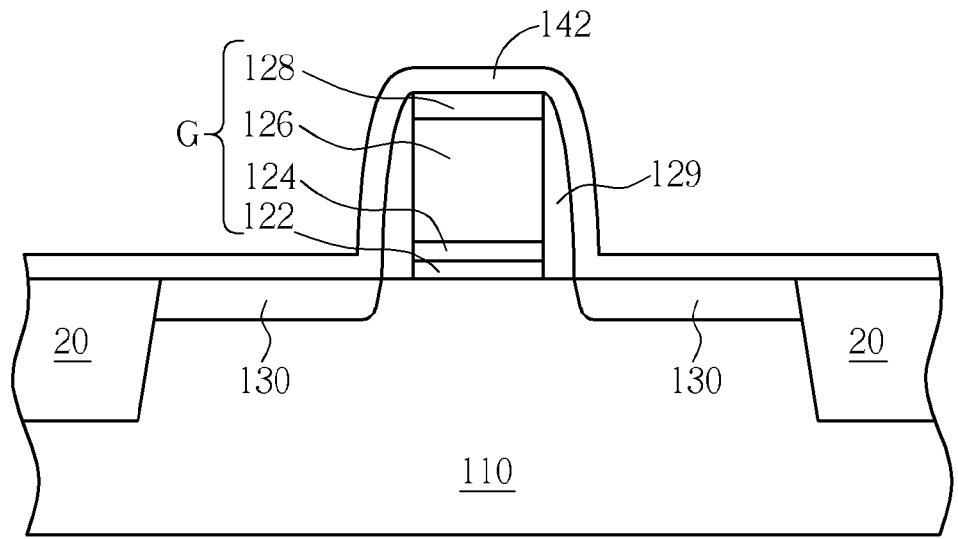
Figure 4:
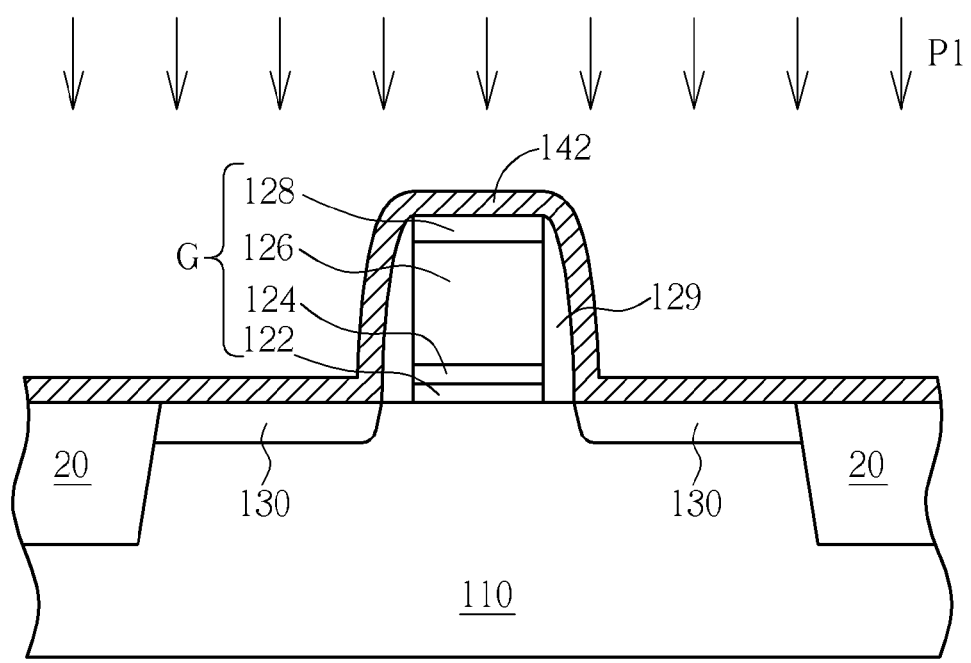

As shown in FIG. 3, an oxide layer 142 is formed to cover the gate structure G and the substrate 110, wherein the oxide layer 142 may be formed by an deposition process or etc. As shown in FIG. 4, a plasma process without oxygen P1 is performed to densify the oxide layer 142. The plasma process without oxygen P1 may include having at least an inert gas, such as helium, argon or etc. imported; or the plasma process without oxygen P1 may be a decouple plasma process, but it is not limited thereto. When the processing time of the plasma process without oxygen P1 is too short, the densification of the oxide layer 142 is bad; however, as the processing time of the plasma process without oxygen P1 is too long, the surface of the oxide layer 142 will be damaged by plasma. Therefore, the processing time of the plasma process without oxygen P1 is preferred to be 20 seconds to 120 seconds.

Figure 5:
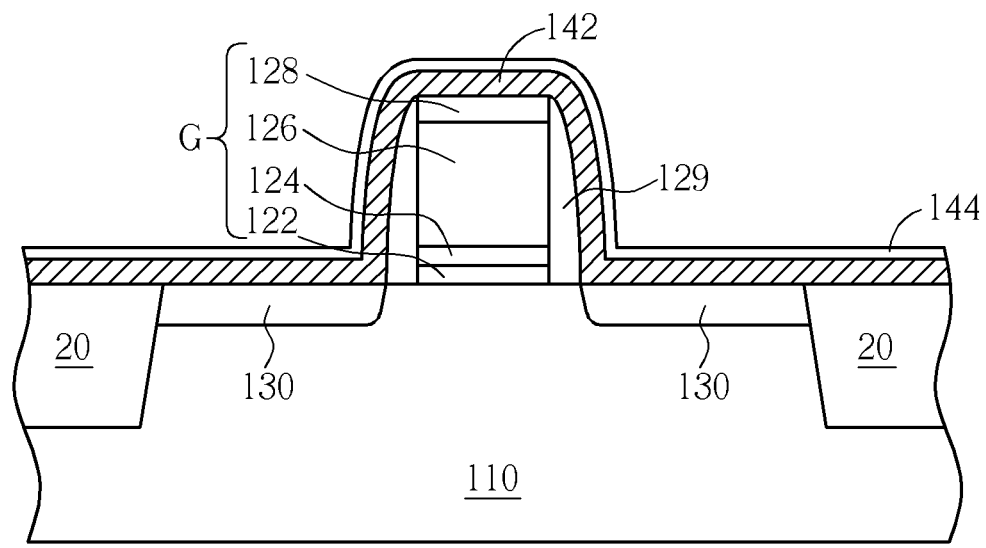
Figure 6:
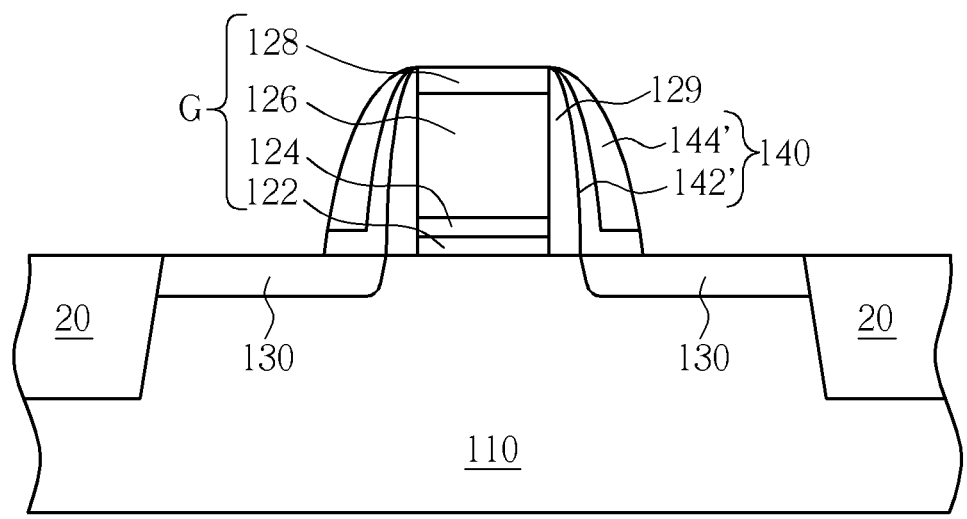

After the plasma process without oxygen P1 is finished, a material layer 144 is formed to cover the oxide layer 142 as shown in FIG. 5. In this embodiment, the material layer 144 is a nitride layer, but it is not limited thereto. As shown in FIG. 6, the material layer 144 and the oxide layer 142 are etched at the same time to form a dual spacer 140. By doing this, the dual spacer 140 may therefore be an inner oxide layer 142'/outer material layer 144' dual spacer, and the inner oxide layer 142' has an L-shaped cross-sectional profile structure. More precisely, due to the material layer 144 being a nitride layer, the dual spacer 140 is an inner oxide layer 142'/outer nitride layer dual spacer, and the etching process for etching the nitride layer may be a non-isotropic dry etching process, but it is not limited thereto. In another embodiment, the material layer 144 may be composed of other materials, so that the dual spacer 140 may be an inner oxide layer 142'/outer material layer dual spacer, depending upon the needs or etchants of the etching processes carried out to form the dual spacer 140 or recesses etc.

In this embodiment, two layers (the oxide layer 142 and the material layer 144) are formed and then etched at the same time, so that the inner oxide layer 142' has an L-shaped cross-sectional profile structure. In another embodiment, the oxide layer 142 and the material layer 144 may be formed and etched respectively. That is, the oxide layer 142 may be formed and etched before the material layer 144 is formed, which will also be etched in a later step. This way, the cross-sectional profile structure of the inner oxide layer 142' and the outer material layer 144' can be controlled. In still another way, the oxide layer 142 and the material layer 144 may be formed, and then the material layer 144 and the oxide layer 142 may be etched respectively to form the dual spacer 140 with a desired cross-sectional profile.

Figure 7:
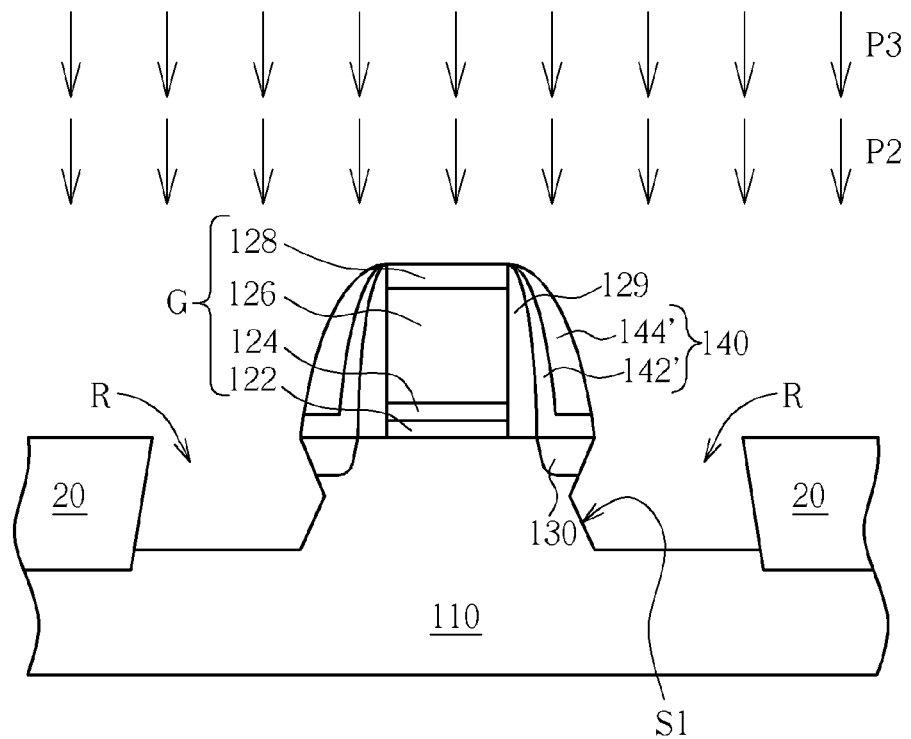

As shown in FIG. 7, an etching process P2 is carried out to form two recesses R in the substrate 110 outside the dual spacer 140. The etching process P2 may include a dry etching process and/or a wet etching process etc. For instance, a dry etching process may be performed to form a determined depth of the recesses R, and then a wet etching process is performed to horizontally widen the recesses R, so that the recesses R can have a diamond shaped cross-sectional profile or other shaped cross-sectional profile.

A cleaning process P3 is performed to clean the surface S1 of the recesses R, so that impurities, such as native oxide on the surface S1 of the recesses R, can be removed. The cleaning process P3 may be a dilute hydrofluoric acid containing cleaning process, but it is not limited thereto. It is emphasized, due to the inner oxide layer 142' and native oxide being oxides, that parts of the inner oxide layer 142' will be removed as the native oxide is removed while the cleaning process P3 is performed if the plasma process without oxygen P1 was not performed before thereby damaging the inner oxide layer 142'. Since parts of the inner oxide layer 142' are removed, aforesaid advantages of the inner oxide layer 142' are eliminated. For example, aforesaid advantages of the inner oxide layer 142' include preventing the first spacer 129 beside the inner oxide layer 142' or the lightly doped source/drain region 130 below the inner oxide layer 142' from being damaged while the outer material layer 144' is removed. However, by applying the plasma process without oxygen P1 to densify the oxide layer 142 in the present invention, the structure of the oxide layer 142 can be strengthened, and the removal of the inner oxide layer 142' together with the native oxide can be avoided when the cleaning process P3 is performed.

Figure 8:
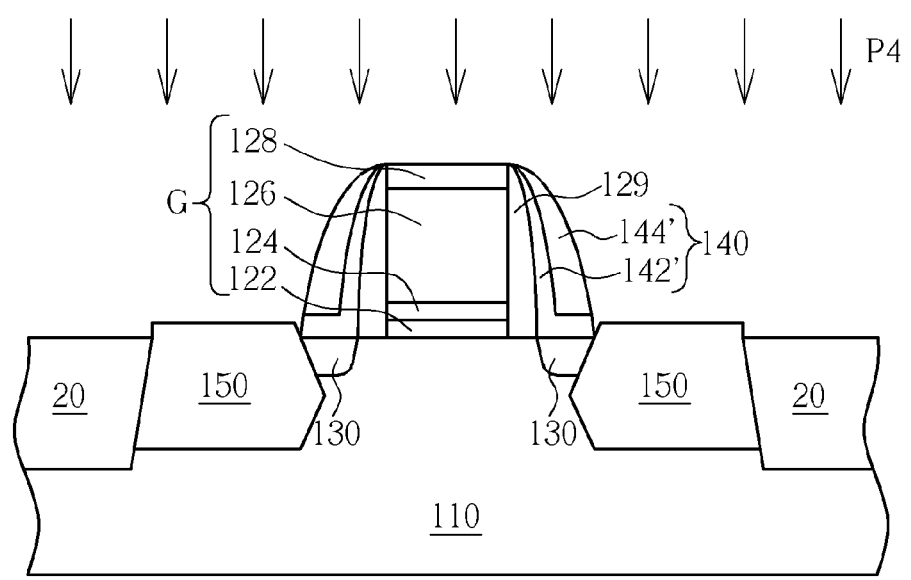

After the cleaning process P3 is finished, an epitaxial process P4 is performed to form an epitaxial structure 150 in the recesses R, as shown in FIG. 8. The epitaxial structure 150 may be a silicon germanium epitaxial layer used for forming a P-MOS transistor, or a silicon carbide epitaxial layer used for forming an N-MOS transistor, but it is not limited thereto.

Figure 9:
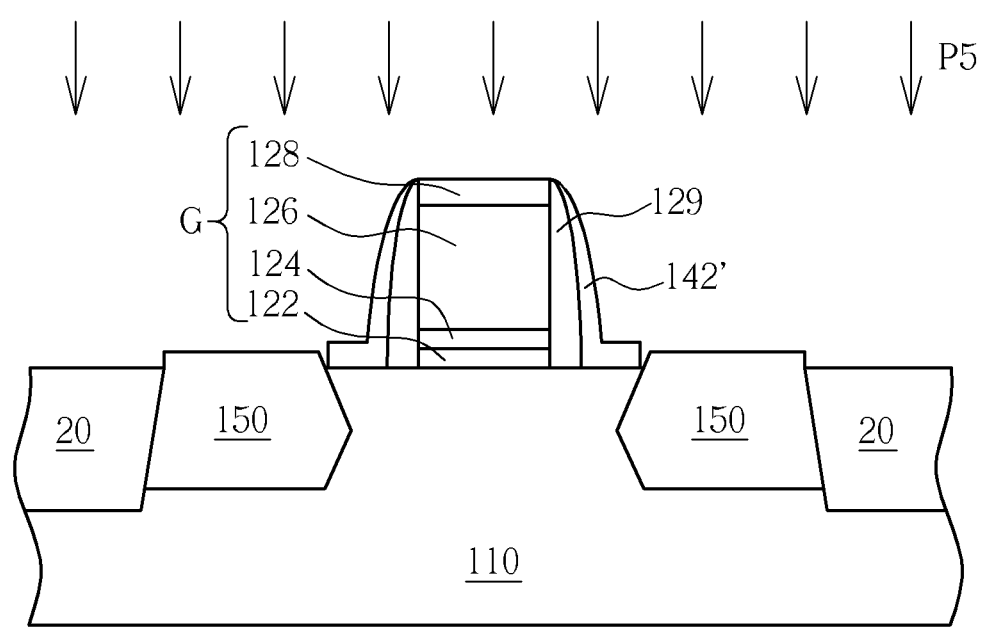

As shown in FIG. 9, an etching process P5, such as a phosphoric acid containing wet etching process, is performed in order to remove the outer material layer 144'. This way, the inner oxide layer 142' below the outer material layer 144' is exposed. In later processes, the inner oxide layer 142' may be selectively removed. A main spacer (not shown) may be formed to define a source/drain region. The source/drain region is formed in the substrate beside the main spacer (not shown). Then, subsequent semiconductor processes may be performed, such as a salicide process may be performed on the source/drain region (not shown); a contact etch stop layer (CESL) may entirely be covered; an interdielectric layer (not shown) may be formed on the contact etch stop layer (CESL); the interdielectric layer (not shown) and the contact etch stop layer (CESL) may be planarized; a metal replacement process may be performed; contact holes (not shown) may be formed in the interdielectric layer (not shown); metal plugs (not shown) may be formed in the contact holes (not shown) or etc.

Although the material layer 144 may be made of other materials except for nitride, the materials of the material layer 144 and the oxide layer 142 are preferred to have different etching selectivity ratio. That means that the material layer 144 and the oxide layer 142 should have different etching rates while an etching process is performed. In general, the material layer 144 and the spacer 129 are composed of common or similar materials. Regardless of the material layer 144 and the first spacer 129 being formed by different precursors, materials of the material layer 144 and the spacer 129 still have similar material properties, so that the first spacer 129 will be removed as the material layer 144 is removed while the first spacer 129 and the material layer 144 have no other materials between them, thereby damaging the first spacer 129. As the materials of the material layer 144 and the oxide layer 142 have different etching selectivity ratio, the oxide layer 142 can be an etching stop layer, while the material layer 144 is etched. Besides, due to the oxide layer 142 remaining after the material layer 144 is etched, the lightly doped source/drain region 130 below the L-shaped cross-sectional profile structure of the oxide layer 140 can be protected.

In summary, the present invention provides a semiconductor process, which forms a dual spacer containing an inner oxide layer and an outer material layer, and then performs a plasma process without oxygen, immediately after the oxide layer is formed to densify the oxide layer in the dual spacer, thereby preventing the oxide layer from being consumed by later etching processes, specifically wet etching processes. More precisely, the wet etching process may be a pre-cleaning process performed after recesses are formed and before an epitaxial layer is formed, wherein a pre-cleaning process is used to clean the native oxide, or etc. Due to the plasma process without oxygen being applied in the present invention for densifying the oxide layer, the structure of the oxide layer can therefore be strengthened, thereby the oxide layer consumption during the etching processes can be avoided. Thus, the properties of the oxide layer of the present invention, such as protecting a first spacer beside it and a lightly-doped source/drain region or a substrate below it, can be fully maintained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
    forming a gate structure on a substrate;
    forming an oxide layer covering the gate structure and the substrate;
    performing a plasma process without oxygen to densify the whole oxide layer;
    forming a material layer covering the oxide layer; and
    etching the material layer and the oxide layer simultaneously to form a dual spacer, wherein the top of the material layer and the top of the oxide layer are at a same level.

2. The semiconductor process according to claim 1, wherein the plasma process without oxygen comprises having at least an inert gas imported.

3. The semiconductor process according to claim 2, wherein the inert gas comprises helium gas.

4. The semiconductor process according to claim 2, wherein the inert gas comprises argon gas.

5. The semiconductor process according to claim 1, wherein the plasma process without oxygen comprises having nitrogen gas imported.

6. The semiconductor process according to claim 1, wherein the material layer comprises a nitride layer.

7. The semiconductor process according to claim 6, wherein the dual spacer comprises an inner oxide layer/outer nitride layer dual spacer.

8. The semiconductor process according to claim 7, wherein the inner oxide layer of the dual spacer has an L-shaped cross-sectional profile structure.

9. The semiconductor process according to claim 1, wherein the processing time of the plasma process without oxygen is 20 seconds to 120 seconds.

10. The semiconductor process according to claim 1, wherein the plasma process without oxygen comprises a decouple plasma process.

11. The semiconductor process according to claim 1, further comprising:
    performing an etching process to form at least a recess in the substrate outside the dual spacer after the dual spacer is formed.

12. The semiconductor process according to claim 11, wherein the etching process comprises a dry etching process or a wet etching process.

13. The semiconductor process according to claim 11, further comprising:
    performing a cleaning process to clean the surface of the recess after the etching process is performed; and
    performing an epitaxial process to form an epitaxial structure in the recess.

14. The semiconductor process according to claim 13, wherein the cleaning process comprises a dilute hydrofluoric acid containing cleaning process.

15. The semiconductor process according to claim 1, further comprising:
    performing an etching process to remove the material layer remaining after the etching following the formation of the dual spacer.

16. The semiconductor process according to claim 15, wherein the etching process comprises a phosphoric acid containing wet etching process.

* * * * *